United States Patent [19]

Yung

[11] Patent Number: 5,274,264
[45] Date of Patent: Dec. 28, 1993

[54] DEFECT TOLERANT POWER DISTRIBUTION NETWORK AND METHOD FOR INTEGRATED CIRCUITS

[75] Inventor: Michael W. Yung, Los Angeles, Calif.

[73] Assignee: Hughes Aircraft Company, Los Angeles, Calif.

[21] Appl. No.: 626,645

[22] Filed: Dec. 12, 1990

[51] Int. Cl.$^5$ .................. H01L 27/02; H01L 27/10; H01L 23/48

[52] U.S. Cl. .................. 257/529; 257/530; 257/758; 257/920

[58] Field of Search .................. 357/40, 65, 68, 71; 257/529, 530, 734, 758, 775, 920

[56] References Cited

U.S. PATENT DOCUMENTS 4,733,372  3/1988  Nanbu et al. .................. 365/200

FOREIGN PATENT DOCUMENTS 0388341  9/1990  European Pat. Off. .
2558989  8/1985  France .
1451960  10/1976  United Kingdom .

OTHER PUBLICATIONS

Leftwich et al., "The Infrared Microimager and Integrated Circuits", vol. 104, Multi Disciplinary Microscopy, 1977, SPIE, pp. 104-110 (Already of record).
Moore, "A Review of Fault-Tolerant Techniques for the Enhancement of Integrated Circuit Yield", IEEE Proc., vol. 74, No. 5, May 1986, pp. 684-698.
Fried, "An Analysis of Power and Clock Distribution for WSI Systems", Proc. Workshop on Wafer Scale Integration, 1986, pp. 127-142.
Raffel, "On the Use of Non-Volatile Programmable Links for Restructurable VLSI", Proc. Caltech Conf. on VLSI, 1979, pp. 95-104.
Chapman, "Laser Linking Technology for RVLSI", Proc. Workshop on Wafer Scale Integration, 1985, pp. 204-215.
Hiatt, "A Method of Detecting Hot Spots on Semiconductors Using Liquid Crystals", Proc. Reliability Physics Symposium, 19, 1981, pp. 130-133.

Primary Examiner—Mark V. Prenty
Attorney, Agent, or Firm—V. D. Duraiswamy; W. K. Denson-Low

[57] ABSTRACT

Short circuits in the power distribution network of a circuit structure are accurately located and isolated by providing selected power distribution lines with areas whose width is reduced sufficiently to produce a highly resolved current-induced hot spot in response to a downstream short circuit. The invention is particularly applicable to crossovers of power distribution lines separated by an insulating layer. The upper line is divided into a plurality of spaced parallel channels in the crossover vicinity. The channels each include areas of further reduced width at their opposite ends, preferably outside of but proximate to the crossover area, where the hot spots are formed. A short circuit on any of the channels is isolated by cutting at the areas of further reduced width on either side of the fault. Terminal lines of the power distribution network can also be provided with areas of reduced width proximate to the global power distribution line from which they are supplied; these areas form a hot spot in response to a short circuit on the terminal line, and can be cut to isolate the terminal line. Low level faults can be detected with a high degree of resolution and very small space requirements.

15 Claims, 2 Drawing Sheets

DEFECT TOLERANT POWER DISTRIBUTION NETWORK AND METHOD FOR INTEGRATED CIRCUITS

GOVERNMENT RIGHTS

This invention was made with Government support under Contract No. F30602-87-C-0049 awarded by the Department of the Air Force. The Government has certain rights in this invention.

BACKGROUND OF THE INVENTION

1. Field of the Invention

This invention relates to integrated circuit designs, and more particularly to a power distribution network for wafer scale integrated circuits that is tolerant of short circuits in the distribution network, and a related method for removing such short circuits from the network.

2. Description of the Related Art

An important requirement for the successful fabrication of wafer scale integrated circuits (ICs) is an ability to tolerate manufacturing defects. A considerable amount of investigation has been conducted towards enhancing the defect tolerance of memory circuits and, to a lesser degree, random logic circuits. In general, redundant logic circuits are fabricated on the chip and used as spares in case one of the primary logic circuits is not working properly. If a faulty logic circuit is located, it is removed from the remainder of the IC (generally by using a laser to cut its connection), and a redundant circuit module is switched in to replace it. The use of redundant logic modules is discussed in Moore, "A Review of Fault-Tolerant Techniques for the Enhancement of Integrated Circuit Yield", IEEE Proc., Vol. 74, No. 5, May 1986, pp. 684–698.

Aside from defects in the logic circuits themselves, manufacturing flaws in the power supply busses for these circuits can also significantly degrade the yield rates. A power bus is subject to several kinds of random defects, including open circuits, short circuits between two busses on the same layer, and short circuits between a power bus and either another bus or another part of the circuit structure on a different layer. Short circuits between busses on different layers are the most difficult case from the viewpoint of detection and removal.

An open circuit defect usually manifests itself by disabling the supply of power to a certain portion of the circuitry. This type of defect is not fatal, i.e., it does not render the whole die (or wafer in the case of wafer scale integration) untestable. Open circuits can be tolerated to some extent if all major power busses have considerable width and receive power from both ends. Short circuits, on the other hand, can be fatal depending upon the impedance of the layers involved. If the power bus short circuit involves high impedance layer such as a polysilicon, diffusion or well layer with a resistance on the order of 10 ohms per square or larger, the defect would not be fatal to the metal layered global power busses. However, a circuit module underneath such a short would not function correctly, and would have to be replaced with a substitute circuit module.

It is the short circuits involving the medium impedance layers (resistance on the order of 1 ohm per square) or low impedance layers (such as metal, with resistance on the order of 0.1 ohms per square) that have the potential to be fatal and must be identified and removed. While inter-layer short circuits between a power-carrying metal layer and the substrate can be fatal, the incidence of such faults is quite low. The frequency of short circuits along a crossover of two metal power lines (separated by a dielectric layer) is considerably higher.

The general approach to overcoming faults on power supply lines has been to break up the power distribution network and the associated circuits into many different segments, and to connect up only the good segments after testing them. Power transistors as the connecting mechanism are discussed in Fried, "An Analysis of Power and Clock Distribution for WSI Systems", Proc. Workshop on Wafer Scale Integration, 1986, pp. 127–142, while the use of programmable or laser links is discussed in Raffel, "On the Use of Non-Volatile Programmable Links for Restructurable VLSI", Proc. Caltech Conf. on VLSI, 1979, pp. 95–104, and Chapman, "Laser Linking Technology for RVLSI", Proc. Workshop on Wafer Scale Integration, 1985, pp. 204–215. An additional layer of metal may also be used as the connecting mechanism.

The above approach is inherently inefficient. If the number of segments is not very large, a single defect can still render significant portions of the circuits inoperative. If the number of segments is increased, the wafer area required for the test input/output interface drivers and pads increases, and the time required for activating laser links also increase proportionately.

In attempting to optimize the circuit design, rather than to accommodate unintended short circuits, a number of imaging techniques have been used in the IC industry for failure and yield analysis. In one such technique, the circuit to be analyzed is coated with a film of cholesteric liquid crystals, and the substrate is heated to slightly below the liquid crystal's transition temperature. Current is then applied to the circuit so that hot spots in the circuit are above the transition temperature, causing the liquid crystal above the hot spots to turn black. This technique is disclosed in Hiatt, "A Method of Detecting Hot Spots on Semiconductors Using Liquid Crystals", Proc. Reliability Physics Symposium. 19, 1981, pp. 130–133. Infrared thermal imaging has also been used to detect hot spots for circuit analysis purposes, as discussed in Leftwich and Kintigh, "The Infrared Microimager and Integrated Circuits", SPIE, Vol. 104, Multidisciplinary Microscopy, 1977, pp. 104–110.

Infrared imaging is generally preferable to liquid crystal detection because it is more efficient, and is also free of the possible device damage and contamination by the chemicals associated with liquid crystal processing. Infrared thermal imaging uses radiation with wavelengths of about 2 to 15 microns. When external power is applied to the circuit, hot spots due to short circuits in the power distribution network usually radiate energy with a wavelength within this range. However, in some cases this technique does not accurately resolve the location of the hot spot. Spatial resolution is limited not only by the long radiation wavelength, but also by the nature of the short circuit and the heat conduction characteristics of the materials surrounding the short. A relatively large area may be heated around the actual short circuit location, and the hot spot may be so blurred that it cannot be detected at all. Also, for small area or partial short circuits in which the short circuit current density is relatively low, there may not be enough heating to produce a detectable hot spot in the first place.

SUMMARY OF THE INVENTION

The present invention seeks to provide a defect tolerant power distribution network, and an associated method for detecting and removing short circuits from the network, that is efficient, economical of surface area, does not require a large amount of time to implement, locates short circuits with a high degree of resolution, and is capable of detecting low level short circuits.

These advantages are achieved by providing at least some of the conductive lines of a power distribution network with an area whose width is reduced relative to the remainder of the line. The amount of width reduction is sufficient to produce a hot spot in response to current flow to a short circuit at an electrically downstream location on the line. Once it has been located as pertaining to a specific hot spot, the short circuit can be removed from the remainder of the network, such as by laser cutting.

The invention is particularly applicable to crossovers of power distribution lines that are separated by an insulating layer. The upper line is fabricated in the vicinity of the crossover area as a plurality of severable channels that are electrically connected in parallel between, and are narrower than, the portions of the upper line which are removed from the vicinity of the crossover area. At least a portion of each channel is narrow enough to produce the desired hot spot in response to a short circuit between the channel and the line which it crosses over. The channels preferably include areas proximate to their opposite ends whose width is further reduced, so that a hot spot occurs on such an area in response to the short circuit. The areas of further reduced width are preferably formed outside of, but proximate to, their associated crossover areas.

The invention is also applicable to the detection of short circuits in terminal lines that extend from global power distribution lines to functional sub-circuits. The terminal line includes an area of reduced width proximate to its associated global power distribution line; the area is sufficiently narrow to produce a hot spot in response to a short circuit on the terminal line. The terminal line is then removed from the remainder of the circuit by opening it at the area of reduced width; it can be replaced with a redundant circuit module.

These and other features and advantages of the invention will be apparent to those skilled in the art from the following detailed description, taken together with the accompanying drawings, in which:

DETAILED DESCRIPTION OF THE INVENTION

Figure 1:
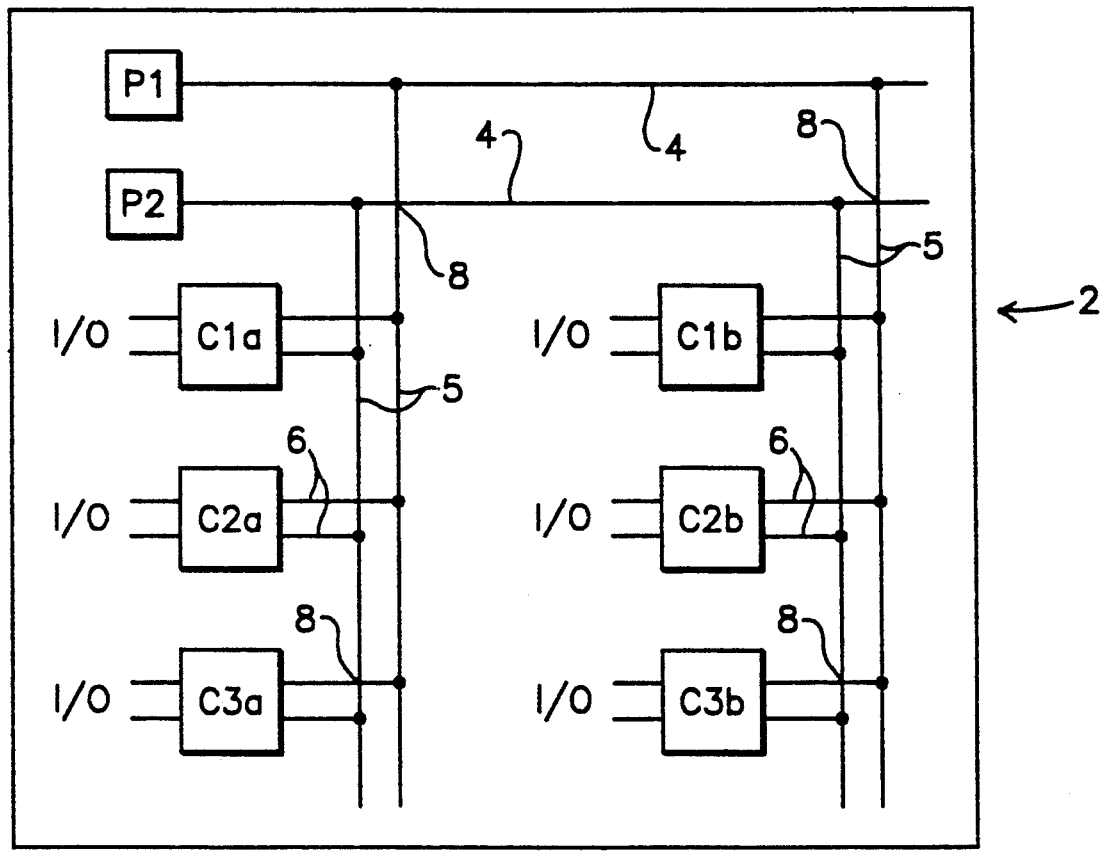
FIG. 1 is a highly simplified schematic diagram of a power distribution network on an IC chip.

A simplified depiction of a power distribution network on an IC chip or wafer 2 is illustrated in FIG. 1. The invention is also applicable to power distribution networks on printed circuit boards and the like, but ICs are felt to be the primary application. The network includes global power lines 4 with primary lines 4 and branch lines 5 that distribute power to different areas of the wafer, and terminal lines 6 that deliver power from a global distribution line to a specific functional sub-circuit C1a, C2a, C1b, C2b, etc. (Some of these sub-circuits can be redundant spares for the others). The sub-circuits are also connected to input and output data lines, indicated as I/O lines.

The term "power" as used herein refers to different levels of supply voltage that may be used in the circuit, and also includes a ground voltage reference. Pads P1,P2 are provided on the primary power distribution lines to receive a supply voltage from an external source.

A number of crossovers 8 between two different power distribution lines will normally occur because of the need to route the various power levels throughout the wafer. In general, the number of crossovers will increase as the circuit becomes more complex. These crossover areas generally constitute the portion of the power distribution network that is most susceptible to fatal short circuits.

Figure 2:
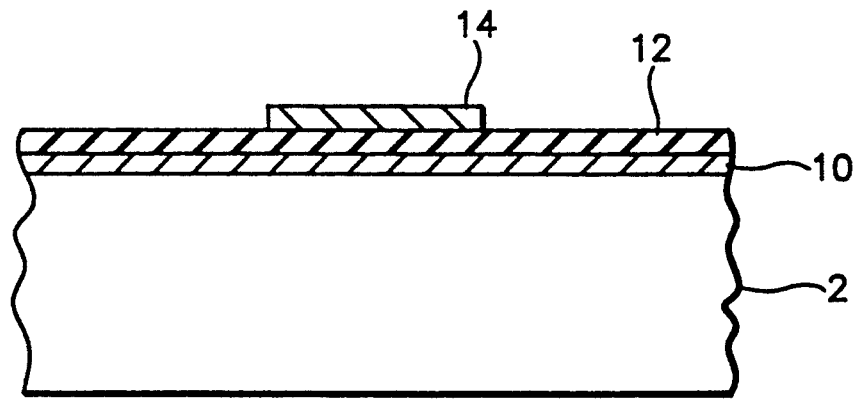
FIG. 2 is a sectional view of a crossover between two power distribution lines.

A sectional view of such a crossover is given in FIG. 2. A lower metal lead 10 is shown extending from left to right on the chip or wafer substrate 2. The lower lead 10 is capped by a layer of insulating material 12, with an upper metallic lead 14 extending into the page over the insulating layer, and electrically isolated thereby from the lower lead 10. The "crossover area" is defined as the area of overlap between the upper and lower leads. Additional metal and dielectric layers might also be provided, resulting in further crossovers.

Figures 3, 4:
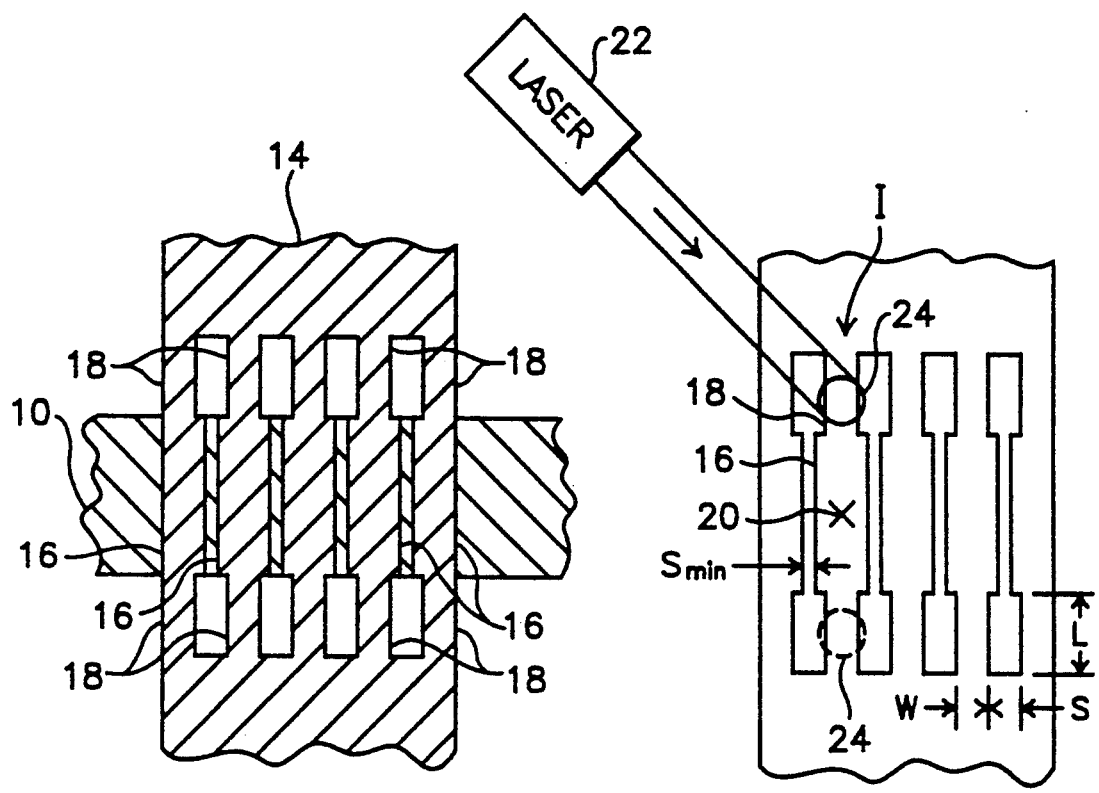
FIG. 3 is a plan view of a power distribution line crossover implemented in accordance with the invention.
FIG. 4 is a plan view illustrating the isolation of a short circuit in a distribution line crossover.

An application of the invention that facilitates the detection and removal of short circuits between the crossed over power distribution lines is shown in FIG. 3. The upper line 14 is divided within the crossover area into a plurality of channels 16, each having a substantially narrower width than the width of line 14 in the areas removed from the crossover vicinity. Outside of the crossover region, the channels 16 may be further reduced in width at areas 18. This is primarily to provide a smaller cut area for removing the channel from the rest of the distribution network in case of a short circuit. The channels can be fabricated in this manner by providing dumbbell-shaped opaque areas in the metallization mask used for the upper layer lines. If desired, the outer dimensions of upper line 14 in the area of channels 16 can be made wider than the remainder of the line 14 remote from the crossover, to compensate for the reduction in metal in the crossover vicinity and to maintain a constant current density along the line.

In the event of a short circuit 20 between one of the channels 16 and the underlying line 10, a high current I will flow through the associated area 18 of further reduced width to the downstream fault location. This will produce a hot spot at reduced width area 18, where the current density is highest because it is the narrowest portion of the current path. Current will also flow into the fault from the opposite end of the channel, if the power distribution network is set up to provide power from either direction at this location. The hot spot at area 18 indicates the presence of a short circuit somewhere along the channel 16 of which it is a part, but the exact location of the short need not be known. Even without areas of reduced width 18, an inter-line short circuit along one of the channels 16 will normally produce a detectable hot spot along the channel because it is so much narrower than the rest of the line 14.

Once a shorted channel has been identified by the presence of a hot spot either on the channel itself or on one of its areas 18 of reduced width, it is removed from the remainder of the power distribution network by opening up the channel and disconnecting it from the remainder of the circuit at the narrowed areas 18 at either end. This is preferably accomplished with a laser 22, as indicated in FIG. 4. The laser spot 24 should exceed the width of area 18 but not overlap onto adjacent channels. As an alternate to a laser, a focused ion beam (FIB) could be used to give an even more precise cut, although the FIB process takes longer. An ultrasonic mechanical probe might also be used, although this is less precise than either laser or FIB cutting, and would not be preferred. The areas 18 of reduced width are preferably just outside of the actual crossover area so that the cutting process does not damage the lower metallic line 10, and also so that a short circuit anywhere along the channel in the crossover area will be isolated by cutting at the reduced width areas 18.

A commercially available infrared thermal imaging microscope is preferably used to detect the hot spot, although as mentioned above liquid crystal films can also be used for hot spot detection. The wafer is first scanned with a low magnification lens to identify all the major short circuits and note their rough coordinates. Higher magnification lenses would then be used to accurately locate the short circuits for the defect isolation operation. Channeling the fault current through the narrow channels, and through the areas of reduced width 18 if they are provided, produces a hot spot that can be located with a high degree of resolution. Without dividing the line into narrow channels, the obtainable resolution is limited not only by the long wavelength of the radiation (about 5-10 microns), but also by the lower thermal density resulting from spreading the fault current over a wider area of metal.

The narrowed areas 18 may be characterized by their widths W, their lengths L, and the spacing S between adjacent areas 18. These dimensions are determined in part by the operational characteristics of the laser, such as its spot size and power. The pitch (W+S) is determined by the resolution of the infrared microscope. The spacing between the channels 16 in the crossover area should match the circuit layout design rule for the minimum spacing to maximize the conductance of the channels. The minimum channel spacing $S_{min}$ should also be large enough to inhibit inter-channel shorts. Depending upon the specific values of these parameters, the loss of conductance compared to a conventional solid metal lead can be made less than 50% per unit length along the channels. Since the ratio of overlapping to non-overlapping areas in the whole power distribution network is very small, the overall loss in conductance is minimal. Alternately, the outer dimensions of the lead can be made wider in the crossover area, as suggested above.

In an IC, it is preferable that a crossover involving a primary power bus be divided into more than six channels. The minimum channel widths W would generally be within the approximate range of 1-20 microns, and the other dimensions are also selectable. However, a suitable set of dimensions (in microns) for IC purposes is:

W=10
L=10
S=4
$S_{min}$=2.5

The above dimensions are for a primary power bus. For a branch power bus, 3-6 channels would preferably be used and the W dimension would be reduced to about 6 microns. Somewhat larger dimensions would generally apply in the case of a printed circuit board.

The supply current level I should be properly selected to generate a hot spot from a channel short circuit. Too low a current will not generate sufficient temperature to be detected, but too high a current can create other problems. For example, narrow conductor traces might be destroyed or degraded by a high current level, and multiple probes could be required to support a current above several hundred milliamperes. The actual current value depends upon the dimensions of the conductor traces, the number of short circuits anticipated and the number and location of the power supply probes. In general, about 300 mA has been found to be required to consistently heat up a single short circuit, although 150-200 mA will suffice in some cases.

Another factor to be considered is the ability to correlate the infrared and optical images from an infrared thermal imaging microscope to accurately locate the hot spots. The imaging system has a built-in optical microscope that can provide a rough correlation between the visual and infrared images if carefully calibrated. However, this accuracy is lost when software zooming is used. A reliable way to obtain the necessary correlation is to correlate the emissivity map to the temperature map using the system's built-in cursors. Since the emissivity map shows the circuit features that correspond to different materials, a hot spot location accuracy to about 5 microns can be achieved by comparing the emissivity map to a highly magnified optical image around the area. This approach has some limitations, however, such as when an inter-layer short occurs within a large conductor region where little emissivity contrast is present within the observed frame.

Figure 5:
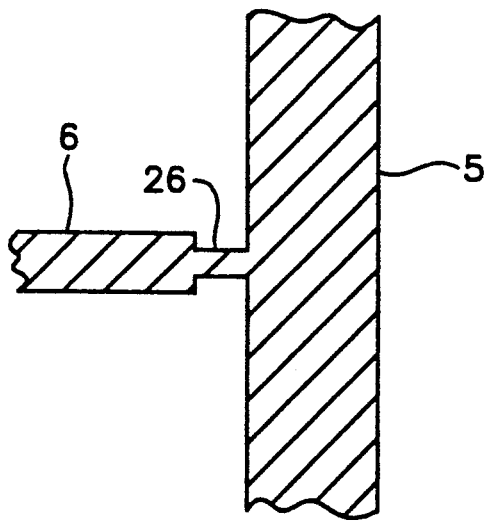
FIG. 5 is a plan view of a power distribution terminal line implemented in accordance with the invention.

The invention is also applicable to the detection and isolation of short circuits on terminal lines of the power distribution network. Such a terminal line 6 connected to a branch line 5 of the global power distribution network is shown in FIG. 5. In this case, the terminal line 6 is provided with an area of reduced width 26 proximate to the branch line 5. The width of area 26 is selected so that a highly resolved hot spot will form there in response to current flow to a fault on the terminal line 6. The terminal line is then opened at the reduced width area 26 by laser cutting or other suitable means, and the fault thereby isolated from the remainder of the system. This also removes from the system the circuit module to which terminal line 26 is connected, but the circuit module can be replaced with a redundant module in standard fashion.

The present invention can be used to successfully detect and accurately resolve the presence of low level short circuits, while requiring only a very small portion of the substrate area. While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A circuit structure, comprising:
   a substrate, a plurality of functional subcircuits on said substrate, and a power distribution network on said substrate connected to supply power to said subcircuits, said power distribution network having conductive power distribution lines of predetermined widths, at least some of said lines including an area whose width is reduced relative to the remainder of the line sufficiently to produce a current-induced hot spot at said area of reduced width in response to a short circuit at an electrically downstream location on said line, said power distribution network including a crossover of power distribution lines separated by an insulating layer, the upper lie of said crossed over lines in the vicinity of the crossover area comprising a plurality of spaced channels that are electrically connected in parallel between, and are narrower than, the portions of said upper line removed from the vicinity of the crossover area, at least a portion of said channels being narrow enough to produce a hot spot in response to a short circuit between said channel and the lower line which it crosses over.

2. The circuit structure of claim 1, said channels each including areas proximate to their opposite ends whose width is further reduced with respect to the remainder of the channel, so that a hot spot occurs on said areas of further width reduction in response to a short circuit between said channel and the power distribution line which it crosses over.

3. The circuit structure of claim 2, wherein said areas of further reduced width are formed on said channels outside of but proximate to their associated crossover areas.

4. The circuit structure of claim 3, the widths of said areas of reduced width being in the approximate range of 1-20 microns.

5. A method of eliminating an interlayer short circuit from a power line included within the power distribution network for a circuit, said circuit including a plurality of functional subcircuits supplied with power by said power distribution network, comprising:
providing said power line as a plurality of channels electrically connected in parallel at an interlayer crossover within the power distribution network,
applying current to the power distribution network,
isolating the location of a short circuit at said interlayer crossover by detecting and locating a hot spot created by a large current flow along a channel at the short circuit location, and
removing said channel thus located from the remainder of the power distribution network without altering the functional connection of any of said functional subcircuits within said circuit.

6. A method of eliminating interlayer short circuits from the power distribution network of a circuit, comprising:
constructing crossovers of power distribution lines within the power distribution network by separating the crossover lines by a layer of insulating material and fabricating the upper line in the vicinity of the crossover area as a plurality of spaced channels that are electrically connected in parallel between, and are narrower than, the portions of said upper line removed from the vicinity of the crossover area,
applying current to the power distribution network, isolating the location of a short circuit between one of said channels and the crossed over line by detecting and locating a hot spot in said channel created by a large current flow at the short circuit location associated with said short circuit, and
removing the portion of the power distribution network thus located from the remainder of the power distribution network by disconnecting the channel associated with said short circuit from the remainder of said upper line.

7. The method of claim 6, wherein said channels are each formed with areas of further reduced width proximate to their opposite ends so that a hot spot occurs on an area of further reduced width when there is a short circuit on the channel of which it is part.

8. The method of claim 7, wherein a channel with a hot spot at an area of further reduced width is disconnected from its power distribution line by opening the opposite ends of said channel at its areas of further reduced width.

9. The method of claim 7, wherein said areas of further reduced width are formed on said channels outside of but proximate to their associated crossover areas.

10. A method of eliminating interlayer short circuits from the power distribution network of a circuit, comprising:
applying current to the power distribution network,
isolating the location of the short circuit by detecting and locating a hot spot created by a large current flow at the short circuit location, at least one terminal line of said power distribution network which extends from a global power distribution line being formed with an area of reduced width proximate to said global power distribution line so that a hot spot occurs at said area of reduced width for a short circuit along said terminal line, and
removing the portion of the power distribution network thus located from the remainder of the power distribution network.

11. The method of claim 10, wherein said terminal line with a hot spot at an area of reduced width is removed from said global power distribution line by opening the terminal line at said area of reduced width.

12. The method of claim 5, wherein said portion of the power located channel is removed from the remainder of the power distribution network by laser cutting.

13. A circuit structure, comprising:
a substrate, and
a power distribution network on said substrate having conductive power distribution lines of predetermined widths, at least some of said lines including an area whose width is reduced relative to the remainder of the line sufficiently to produce a current-induced hot spot at said area of reduced width in response to a short circuit at an electrically downstream location on said line, said power distribution network including a crossover of power distribution lines separated by an insulating layer, the upper lie of said crossed over lines in the vicinity of the crossover area comprising a plurality of spaced channels that are electrically connected in parallel between, and are narrower than, the portions of said upper line removed from the vicinity of the crossover area, at least a portion of said channels being narrow enough to produce a hot spot in response to a short circuit between said channel and the lower line which it crosses over.

14. The circuit structure of claim 13, said channels each including areas proximate to their opposite ends whose width is further reduced with respect to the remainder of the channel, so that a hot spot occurs on said area of further width reduction in response to a short circuit between said channel and the power distribution line which it crosses over.

15. The circuit structure of claim 14, wherein said areas of further reduced width are formed on said channels outside of but proximate to their associated crossover areas.

* * * * *

UNITED STATES PATENT AND TRADEMARK OFFICE
CERTIFICATE OF CORRECTION

PATENT NO. : 5,274,264
DATED : December 28, 1993
INVENTOR(S) : M. W. YUNG It is certified that error appears in the above-identified patent and that said Letters Patent is hereby corrected as shown below:

Col. 7,
Claim 1, line 14, delete "lie" and insert instead --line--.

Col. 8,
Claim 13, line 60, delete "lie" and insert instead --line--.

Col. 9,
Claim 14, line 5, delete "area" and insert instead --areas--.

Signed and Sealed this

Twelfth Day of September, 1995

Attest:

BRUCE LEHMAN

*Attesting Officer*   *Commissioner of Patents and Trademarks*